United States Patent [19]

Lee

[11] Patent Number: 5,633,612

[45] Date of Patent: May 27, 1997

[54] PRECISION CURRENT MIRROR CIRCUIT

[75] Inventor: Dong-Cheol Lee, Inchon, Rep. of Korea

[73] Assignee: Samsung Electronics Co., Ltd., Suwon, Rep. of Korea

[21] Appl. No.: 536,178

[22] Filed: Sep. 29, 1995

[30] Foreign Application Priority Data

May 22, 1995 [KR] Rep. of Korea ............... 95-12753

[51] Int. Cl.⁶ ..................................... H03F 3/04
[52] U.S. Cl. .............................. 330/288; 323/315
[58] Field of Search ................ 330/288; 323/315, 323/316

[56] References Cited

U.S. PATENT DOCUMENTS 5,311,146  5/1994  Brannon et al. ............... 330/288

*Primary Examiner*—James B. Mullins
*Attorney, Agent, or Firm*—Cushman Darby & Cushman, IP Group of Pillsbury Madison & Sutro LLP

[57] ABSTRACT

A precision current mirror circuit eliminates current-loss on the mirror side, and ultimately causes the current source and output current to be the same. The circuit includes a signal input/output means for outputting a current mirror of an input signal, a current control means for controlling a current difference between the input signal and an output signal of the signal input/output, mean and a current amplifier which amplifies the current, as needed, to perform the current control.

15 Claims, 3 Drawing Sheets

PRECISION CURRENT MIRROR CIRCUIT

BACKGROUND OF THE INVENTION

(1) Field of the Invention

The present invention relates to a precision current mirror circuit, and more particularly, to a mirror circuit which eliminates current loss on a mirror side, and ultimately causes both the current source and output current to be the same.

(2) Description of the Prior Art

A current mirror circuit has two transistors with their base terminals connected to each other. Both transistors are identical; that is, they are fabricated to have matched characteristics so that the same amount of current flows in the two transistors. The current mirror thereby controls a current in one transistor so as to also control a current in the other transistor. With such characteristics, the current mirror is widely used for analog circuits.

FIG. 1 shows a conventional current mirror circuit.

As shown in FIG. 1, the conventional current mirror circuit includes a first transistor Q1 for receiving a supply voltage $V_{cc}$ through an emitter, and having its base terminal, connected to its collector; a second transistor Q2 for receiving the supply voltage $V_{cc}$ through the emitter, and having the base terminal of the first transistor Q1 connected to its own base terminal; and a current source $I_{in}$ having an input for receiving the collector of the first transistor Q1, and having an output terminal grounded.

After the conventional current mirror circuit receives the supply voltage $V_{cc}$, since its collector and base are connected to each other, the first transistor Q1 achieves a diode connection to the current source $I_{in}$, and the current starts to flow.

Since each of the transistors Q1 and Q2 has a base current $I_B$, the current $I_{Q1}$ through the transistor Q1 decreases by as much as the base currents of the transistors, i.e., $2I_B$, as shown in the following expression (1).

$$I_{Q1} = I_{in} - 2I_B \quad (1)$$

The current $I_{Q2}$ (i.e., $I_{out1}$) through the second transistor Q2, being related to the first transistor Q1 in terms of the current mirror, also decreases as much as the base currents of the transistors, i.e., $2I_B$, as shown in the following expression (2).

$$I_{out1} = I_{in} - 2I_B \quad (2)$$

That is, the conventional current mirror has a problem in that the output current $I_{out1}$ of the mirror side decreases as much as the base currents $2I_B$ of the transistors Q1 and Q2 as compared with the input current $I_{in}$. A circuit for reducing the above-identified problem is shown in FIG. 2.

FIG. 2 is a conventional current mirror circuit for reducing the problem of the circuit of FIG. 1, and includes a first transistor Q1 for receiving a supply voltage $V_{cc}$ through its emitter; a second transistor Q2 for receiving the supply voltage $V_{cc}$ through its emitter, and having the base terminal of the first transistor Q1 to its own base terminal; a current source $I_{in}$ having an input for receiving the collector of the first transistor Q1, and having an output terminal grounded; and a third transistor Q3 having the base terminal of the first transistor Q1 connected to its own emitter terminal, and having the collector terminal of the first transistor Q1 connected to its own base terminal, and having its collector terminal grounded.

Since the first transistor Q1 is connected to the current source $I_{in}$ when the supply voltage $V_{cc}$ is applied to the circuit, the current starts to flow.

Because each of the transistors Q1 and Q2 has a base current $I_B$, the current $2I_B$ corresponding to the base currents of the transistors Q1 and Q2 flows through the emitter of the third transistor Q3. The base current $I_{Q3B}$ of the third transistor Q3 is shown in the following expression (3).

$$I_{Q3B} = 2I_B / H_{FE} \quad (3)$$

Consequently, the current $I_{Q1}$ through the first transistor Q1, as shown in the following expression (4), decreases by as much as the base current $I_{Q3B}$ of the third transistor Q3.

$$I_{Q1} = I_{in} - 2I_B / H_{FE} \quad (4)$$

Accordingly, current $I_{Q2}$ through the collector of the second transistor Q2, being related to the first transistor Q1 in terms of the current mirror, decreases by as much as the base current $I_{Q3B}$ of the third transistor Q3. The output current $I_{out2}$ is shown in the following expression (5).

$$I_{out2} = I_{in} - 2I_B / H_{FE} \quad (5)$$

It should be noted that even if the conventional current mirror circuit in FIG. 2 has an improved output current compared with the circuit of FIG. 1, it still has a problem in that the output current $I_{out2}$ of the mirror side decreases by as much as the base current $I_{Q3B}$ of the third transistor Q3 as compared with the input current $I_{in}$.

SUMMARY OF THE INVENTION

An object of the present invention is to provide a precision current mirror circuit which eliminates current loss in the mirror side, and which ultimately causes both the current source and output current to be the same, and therefore solving the above-identified problems in the prior art.

In order to achieve this object, the present invention includes a signal input/output means for outputting an input signal by using a characteristic of a current mirror, a current control means for controlling a current difference between an input signal and an output signal of the signal input/output means, and a current amplifying means for amplifying a current as needed to a current control of the current control means.

DETAILED DESCRIPTION OF THE PREFERRED EMBODIMENTS

Figure 3:
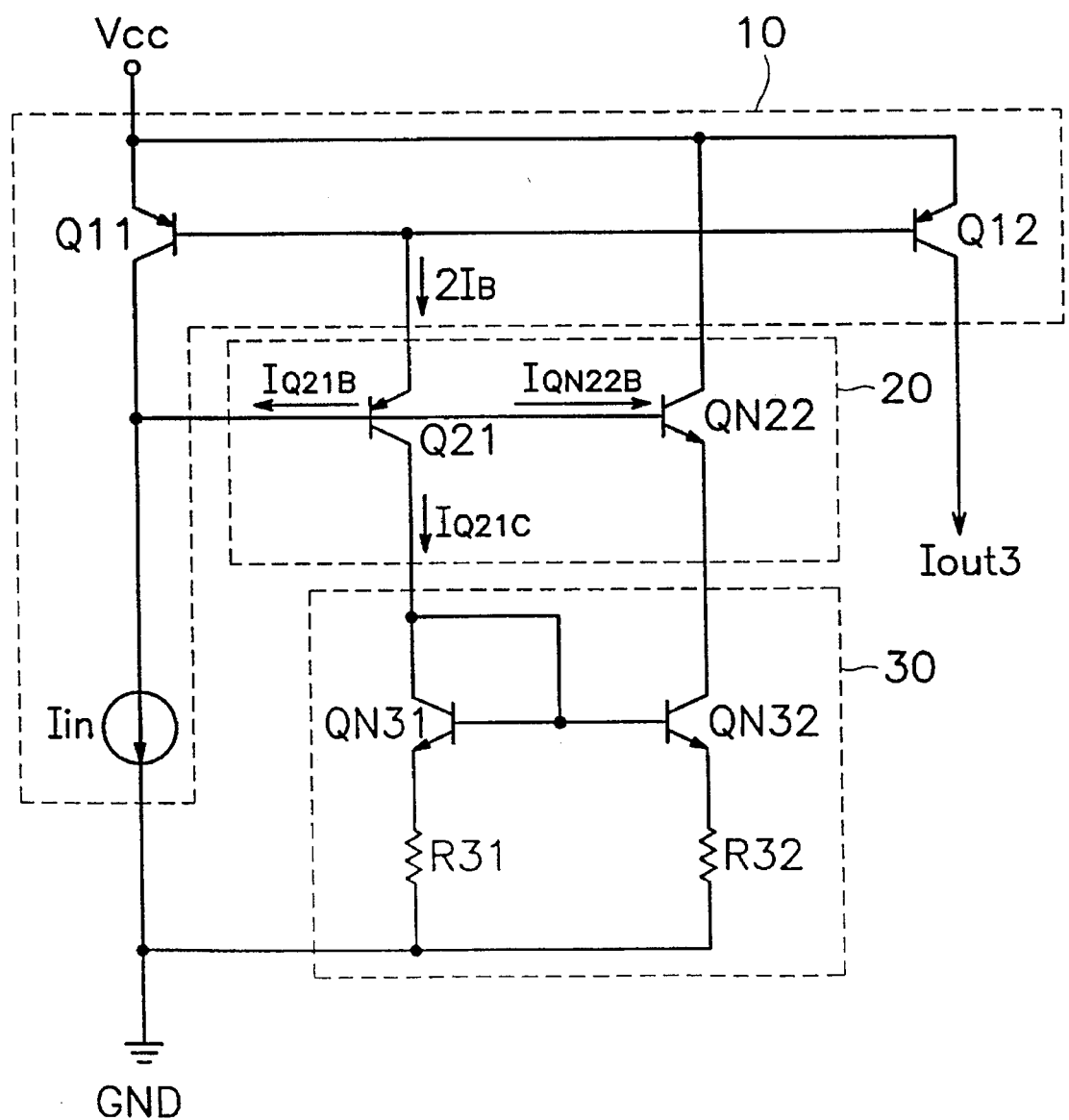
FIG. 3 shows a precision current mirror circuit having a current mirror composed of PNP-type transistor in accordance with a first preferred embodiment of the present invention.

As shown in FIG. 3, a precision current mirror circuit having a current mirror composed of PNP-type transistors in accordance with a first preferred embodiment of the present invention includes a signal input/output means 10 which outputs a current mirror of an input signal, a current control means 20 for controlling the current difference between the input signal and the output signal of the signal input/output means 10, and a current amplifying means 30 for amplifying a current as needed for current control of the current control means 20.

The signal input/output means 10 includes a first transistor Q11 for receiving a supply voltage $V_{cc}$ through an emitter; a second transistor Q12 for receiving the supply voltage $V_{cc}$ through its emitter, and having the base terminal of the first transistor Q11 connected to its own base terminal; and a current source $I_{in}$ having an input for receiving the collector of the first transistor Q11, and having an output terminal grounded.

The current control means 20 includes a first transistor Q21 having the base terminal of the first transistor Q11 of the signal input/output means 10 connected to its own emitter terminal, and having the collector terminal of the first transistor Q11 connected to its own base terminal; and a second transistor QN22 for receiving the supply voltage $V_{cc}$ through its collector, and having the base terminal of the first transistor Q21 connected to its own base terminal.

The current amplifying means 30 includes a first transistor QN31 having the collector of the first transistor Q21 connected to its own collector terminal, and having the base terminal connected to its own collector terminal; a first resistor R31 having the emitter of the first transistor QN31 connected to one side terminal, and having the other side terminal grounded; a second transistor QN32 having the emitter of the second transistor QN22 of the current control means 20 connected to its own collector terminal, and having the base of the first transistor QN31 connected to its own base terminal; and a second resistor R32 having the emitter of the second transistor QN32 connected to one side terminal, and having the other side terminal grounded.

Since the first transistor Q11 is connected to the current source $I_{in}$, when the supply voltage $V_{cc}$ is applied to the circuit, the current starts to flow.

Because each of the transistors Q1 and Q12 of the signal input/output means 10 has a base current $I_B$, the current $2I_B$ corresponding to a sum of the base currents of the transistors Q11 and Q12 of the signal input/output means 10 flows through the emitter of the first transistor Q21 of the current control means 20. The base current $I_{Q21B}$ of the first transistor Q21 of the current control means 20 is shown in the following expression (6).

$$I_{Q21B}=2I_B/\beta_{PNP} \qquad (6)$$

Where, $\beta_{PNP}$ is a current gain of transistor Q21.

Consequently, the current $I_{Q1}$ through the first transistor Q11 of the signal input/output means 10, as shown in the following expression (7), decreases by as much as the base current $I_{Q21B}$ of the first transistor Q21 of the current control means 20.

$$I_{Q11}=I_{in}-(2I_B/\beta_{PNP}) \qquad (7)$$

The collector current $I_{Q21C}$ of the first transistor Q21 of the current control means 20 is described in the following expression (8).

$$I_{Q21C}=2I_B\{B_{PNP}/(B_{PNP}+1)\} \qquad (8)$$

At this time, when the emitter current $I_{QN22E}$ of the second transistor QN22 of the current control means 20 is as shown in the following expression (9), $$I_{QN22E}=(\beta_{NPN}+1)\times(2I_B/\beta_{PNP}) \qquad (9)$$

the base current $I_{QN22B}$ of the second transistor QN22 is identical to the base current $I_{Q21B}$ of the first transistor Q21. Accordingly, the base currents $I_{QN22B}$ and $I_{Q21B}$ cancel each other, and as a result, the current source $I_{in}$ is identical with the output current $I_{out3}$.

A method for adjusting the emitter current $I_{QN22E}$ of the second transistor QN22 to be identical with the above expression (9) in the current amplifying means 30 is described below.

The collector current $I_{Q21C}$ of the first transistor Q21 of the current control means 20 is inputted to each base terminal of both the first transistor QN31 and the second transistor QN32 of the current amplifying means 30. Accordingly, the transistors QN31 and QN32 are turned on. At this time, a current corresponding to the collector current $I_{QN21}$ of the first transistor Q21 of the current control means 20 flows through the first transistor QN31. The emitter current $I_{QN22E}$ of the second transistor QN22 of the current control means 20 flows according to a current of the second transistor QN32 of the current amplifying means 30. At this time, the current is controlled by the resistors R31 and R32 connected to the respective emitters of the transistors QN31 and QN32 of the current control means 30.

That is, when the values of resistors R31 and R32 are properly controlled, taking into consideration of current-loss experienced when the collector current $I_{Q21C}$ of the first transistor Q21 of the current control means 20 is supplied to the respective base terminals of the transistors QN31 and QN32 of the current amplifying means 30, and also taking into consideration an error by a difference of "β" derived from characteristics of the NPN-type transistor and the PNP-type transistor, the emitter current $I_{QN22E}$ of the second transistor QN22 of the current control means 20 can be identical with the above expression (9).

Consequently, since the base current $I_{Q21B}$ of the first transistor Q21 of the current control means 20 is identical with the base current $I_{QN22B}$ of the second transistor QN22, the base currents $I_{Q21B}$ and $I_{QN22B}$ cancel each other. Accordingly, the collector current $I_{Q11C}$ of the first transistor Q11 of the signal input/output means 10 is identical with the current source $I_{in}$ and the output current $I_{out3}$.

Figure 1:
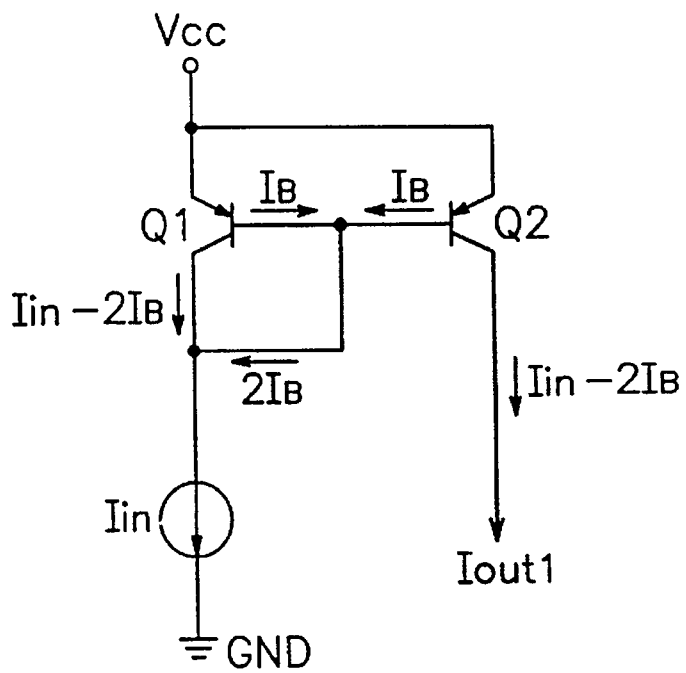
FIG. 1 shows a conventional current mirror circuit.
Figure 2:
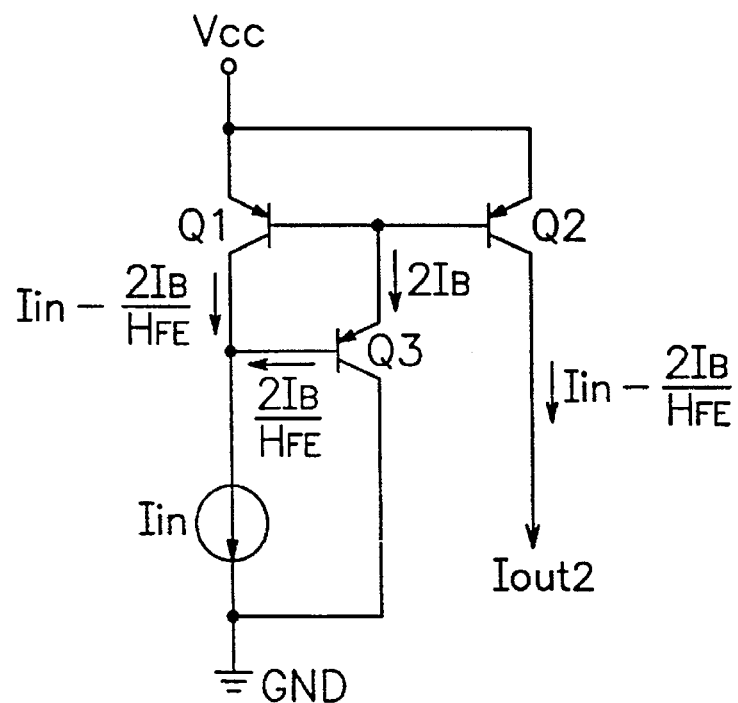
FIG. 2 shows a conventional current mirror circuit for reducing the problem of the FIG. 1 circuit.

When the output current $I_{out}$ of FIG. 3 is compared with that of FIGS. 1 and 2, if the value of '$H_{FE}$' of the PNP-type transistor is below '100', the error ratio of the current mirror circuit in FIG. 3 is 0% irrespective of the value of $H_{FE}$, while the error ratio of the circuit of FIG. 1 is 2% and that of the circuit of FIG. 2 is 0.02%.

Figure 4:
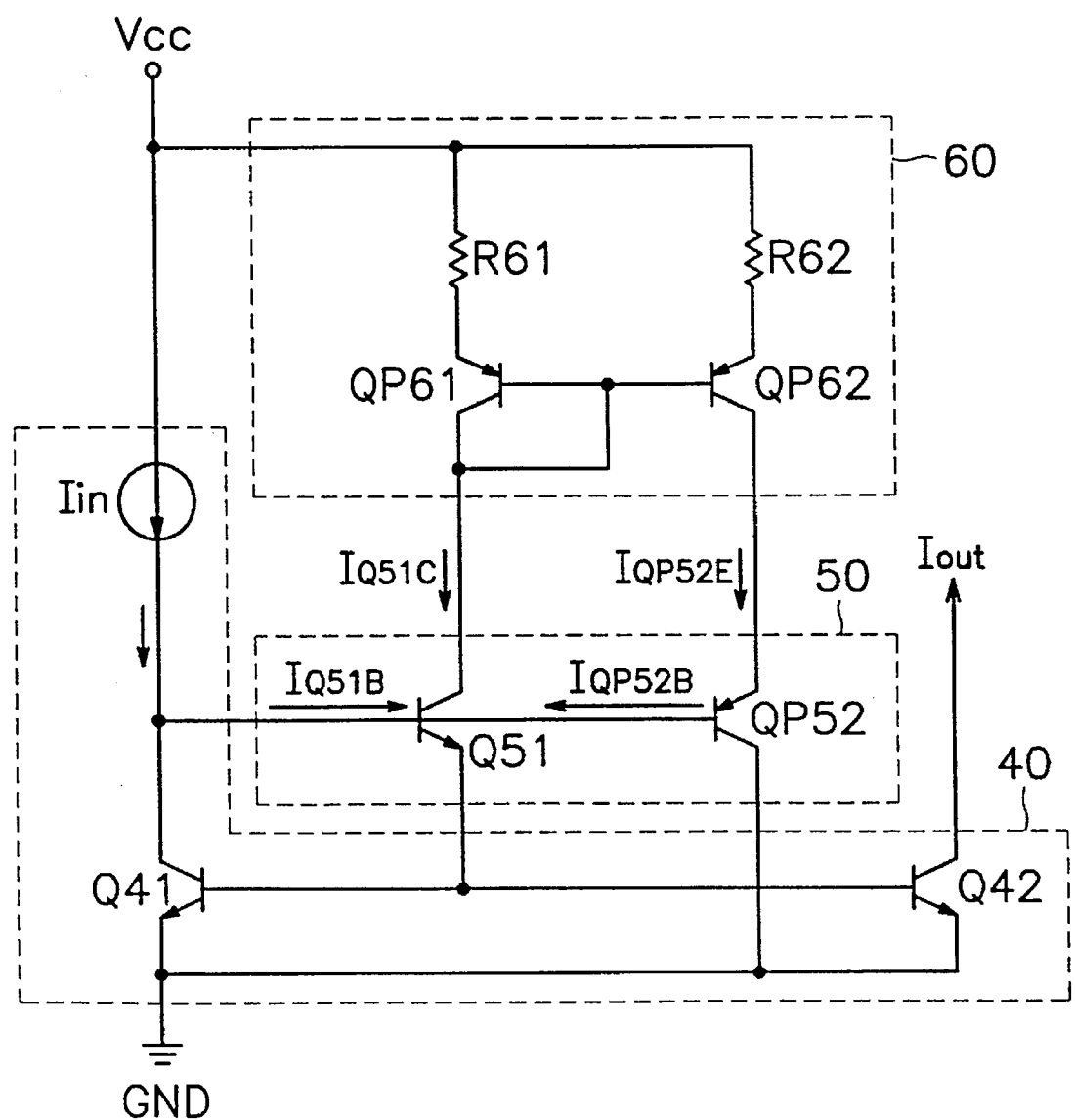
FIG. 4 is a precision current mirror circuit having a current mirror composed of NPN-type transistors in accordance with a second preferred embodiment of the present invention.

A second preferred embodiment of the present invention will become apparent from a study of the following detailed description, when viewed in light of FIG. 4 of the accompanying drawings.

As shown in FIG. 4, a precision current mirror circuit having a current mirror composed of NPN-type transistors in accordance with a second preferred embodiment of the present invention includes a signal input/output means 40 which outputs a current mirror of an input signal, a current control means 50 for controlling the current difference between the input signal and the output signal of the signal input/output means 40, and a current amplifying means 60 for amplifying the current as needed for the current control of the current control means 50.

The signal input/output means 40 includes a current source $I_{in}$ for receiving the supply voltage $V_{cc}$ through an input terminal; a first transistor Q41 having a collector terminal connected to an output terminal of the current source $I_{in}$, and having an emitter terminal grounded; and a second transistor Q42 having a base terminal connected to the base terminal of the first transistor Q41, and having an emitter terminal grounded.

The current control means 50 includes a first transistor Q51 having a base terminal connected to the collector terminal of the first transistor Q41 of the signal input/output means 40, and having an emitter terminal connected to the base terminal of the first transistor Q41 of the signal input/output means 40; and a second transistor QP52 having a base terminal connected to the base terminal of the first transistor Q51, having a collector terminal grounded.

The current amplifying means 60 includes a first resistor R61 for receiving the supply voltage $V_{cc}$ through one side terminal; a first transistor QP61 having an emitter connected to the other side terminal of the first resistor R61, having a collector connected to the collector terminal of the first transistor Q51 of the current control means 50, and having a collector connected with the base; a second resistor R62 for receiving the supply voltage $V_{cc}$ through one side terminal; and a second transistor QP62 having an emitter connected to the other side terminal of the second resistor R62, having a collector connected to the emitter terminal of the second transistor QP52 of the current control means 60, and having a base connected to the base terminal of the first transistor QP61.

The general operation of the circuit of FIG. 4 is the same as that of the first preferred embodiment shown in FIG. 3. Since the respective types of the transistors Q41 and Q42 consisting the signal input/output means 40 are different from those of the transistors Q11 and Q12 of the signal input/output means 10, the current flows in an opposite direction compared with the current direction of the first preferred embodiment.

Namely, when the resistors R61 and R62 are properly controlled, taking into consideration the current lost when the collector current $I_{Q51C}$ of the first transistor Q51 of the current control means 50 is supplied to the respective base terminals of the transistors QP61 and QP62 of the current amplifying means 60, and also taking into consideration an error by a difference of "β" derived from characteristics of the NPN-type transistor and the PNP-type transistor, the emitter current $I_{QN52E}$ of the second transistor QP52 of the current control means 50 can be identical with the following expression (10).

$$I_{QP52E} = (\beta_{PNP}+1) \times (2I_B/\beta_{NPN}) \quad (10)$$

Consequently, since the base current $I_{Q51B}$ of the first transistor Q51 of the current control means 50 is identical with the base current $I_{QP52B}$ of the second transistor QN52, the base currents $I_{Q51B}$ and $I_{QP52B}$ disappear. Accordingly, the collector current $I_{Q41C}$ of the first transistor Q41 of the signal input/output means 40 is identical with the current source $I_{in}$ and the output current $I_{out4}$.

When the output current $I_{out}$ of FIG. 4 is compared with the current mirror circuits of the prior art, if the value of '$H_{FE}$' of the npn type transistor is below '100', the error of the current mirror circuit in FIG. 4 is zero irrespective of the value of $H_{FE}$, while the conventional current mirror circuits have some error.

According to the preferred embodiments of the present invention, the present invention can provide a precision current mirror circuit which eliminates current-loss on the mirror side, and which ultimately causes both the current source and output current to be the same.

What is claimed is:

1. A precision current mirror circuit, comprising:

signal input/output means having a first current mirror of two transistors, the current of one of said transistors being the same as the current of the other of said transistors;

current control means having two different conductivity type transistors, for controlling the base currents of said transistors of said first current mirror of said signal input/output means;

current amplifying means for controlling the currents of said transistors of said current control means by amplifying the currents of said transistors of said current control means so that their base currents cancel each other.

2. The precision current mirror circuit of claim 1, wherein said first current mirror is comprised of two PNP-type transistors.

3. The precision current mirror circuit of claim 2, wherein said signal input/output means is comprised of:

a first transistor connectable to receive a supply voltage through an emitter, said first transistor having a base terminal and a collector;

a second transistor connectable to receive said supply voltage through an emitter, said second transistor having a base terminal, and means for connecting said base terminal of said first transistor to said base terminal of said second transistor; and a current source connectable to receive said collector of said first transistor as an input, and which has an output terminal grounded.

4. The precision current mirror circuit of claim 3, wherein said current control means is comprised of:

a third transistor of a first conductivity type having means for connecting said base terminal of said first transistor of said signal input/output means to an emitter terminal of said third transistor, and means for connecting said collector of said first transistor to a base terminal of said third transistor; and a fourth transistor of a second conductivity type opposite said first conductivity type for receiving said supply voltage through a collector, said fourth transistor having an emitter and means for connecting the base terminal of said third transistor to a base terminal of said fourth transistor.

5. The precision current mirror circuit of claim 4, wherein said current amplifying means is comprised of:

a fifth transistor having means for connecting said collector of said third transistor to a collector of said fifth transistor, and means for connecting a base terminal of said fifth transistor to said collector of said fifth transistor;

a first resistor connected between an emitter of said fifth transistor and ground;

a sixth transistor having means for connecting said emitter of said fourth transistor of said current control means to a collector of said sixth transistor, and means for connecting said base terminal of said fifth transistor to a base terminal of said sixth transistor; and a second resistor connected between an emitter of said sixth transistor and ground.

6. The precision current mirror circuit of claim 1, wherein said signal input/output means is comprised of:

a first transistor connectable to receive a supply voltage through an emitter, said first transistor having a base terminal and a collector;

a second transistor connectable to receive said supply voltage through an emitter, said second transistor having a base terminal, and means for connecting said base terminal of said first transistor to said base terminal of said second transistor; and a current source connectable to receive said collector of said first transistor as an input, and which has an output terminal grounded.

7. The precision current mirror circuit of claim 6, wherein said current control means is comprised of:

a third transistor of a first conductivity type having means for connecting said base terminal of said first transistor of said signal input/output means to an emitter terminal of said third transistor, and means for connecting said collector of said first transistor to a base terminal of said third transistor; and a fourth transistor of a second conductivity type opposite said first conductivity type for receiving said supply voltage through a collector, said fourth transistor having an emitter and means for connecting the base terminal of said third transistor to a base terminal of said fourth transistor.

8. The precision current mirror circuit of claim 7, wherein said current amplifying means is comprised of:

a fifth transistor having means for connecting said collector of said third transistor to a collector of said fifth transistor, and means for connecting a base terminal of said fifth transistor to said collector of said fifth transistor;

a first resistor connected between an emitter of said fifth transistor and ground;

a sixth transistor having means for connecting said emitter of said fourth transistor of said current control means to a collector of said sixth transistor, and means for connecting said base terminal of said fifth transistor to a base terminal of said sixth transistor; and a second resistor connected between an emitter of said sixth transistor and ground.

9. The precision current mirror circuit of claim 1, wherein said first current mirror is comprised of two NPN-type transistors.

10. The precision current mirror circuit of claim 9, wherein said signal input/output means is comprised of:

a current source connectable to receive a supply voltage through an input terminal of said current source;

a first transistor having a collector and an emitter, and means for connecting said collector to an output terminal of said current source, and means for grounding said emitter; and a second transistor having a base terminal, an emitter, means for connecting said base terminal to a base terminal for said first transistor, and means for grounding said emitter terminal.

11. The precision current mirror circuit of claim 10, wherein said current control means is comprised of:

a third transistor of a first conductivity type having a base terminal and an emitter, means for connecting said base terminal to the collector of said first transistor of said signal input/output means, and means for connecting said emitter to said base terminal of said first transistor of said signal input/output means; and a fourth transistor of a second conductivity type opposite said first conductivity type having a base terminal, a collector, means for connecting said base terminal to said base terminal of said third transistor, and means for grounding said collector.

12. The precision current mirror circuit of claim 11, wherein said current amplifying means is comprised of:

a first resistor having two terminals, said supply voltage being received through one of said two terminals;

a fifth transistor having a collector, a base terminal, an emitter, means for connecting said emitter to the other of said two terminals of said first resistor, means for connecting said collector to the collector of said third transistor of said current control means, and means for connecting said collector of said fifth transistor with said base terminal of said fifth transistor;

a second resistor having two terminals, said supply voltage being received through one of said two terminals; and a sixth transistor having a base terminal, a collector, an emitter, means for connecting said emitter to the other of said two terminals of said second resistor, means for connecting said collector to said emitter of said fourth transistor of said current control means, and means for connecting said base terminal to said base terminal of said fifth transistor.

13. A precision mirror circuit having an input terminal connectable to receive an input current and an output terminal which supplies an output current, comprising:

a first current mirror having an input transistor and an output transistor respectively coupled to said input and output terminals, said input and output transistors having their bases connected together at a connection node;

current control means having a first transistor and a second transistor of opposite conductivity types, said first and second transistors having their bases connected to each other and coupled to said input terminal, said current control means controlling the base currents of said input and output transistors of said first current mirror; and a current amplifier coupled to said current control means and controlling currents of said first and second transistors such that their base currents are the same and cancel each other at said input terminal.

14. The precision mirror circuit of claim 13, wherein said input and output transistors are the same conductivity type and have a predetermined current mirror ratio.

15. The precision mirror circuit of claim 14, wherein said predetermined current mirror ratio is 1:1.

* * * * *